(12) United States Patent
Gershen

(10) Patent No.: US 6,252,407 B1
(45) Date of Patent: *Jun. 26, 2001

(54) GROUND FAULT CIRCUIT INTERRUPTER MISWIRING PREVENTION DEVICE

(75) Inventor: Bernard Gershen, Centerport, NY (US)

(73) Assignee: Leviton Manufacturing Co., Inc., Little Neck, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/204,861

(22) Filed: Dec. 3, 1998

Related U.S. Application Data

(62) Division of application No. 08/768,689, filed on Dec. 18, 1996.

(51) Int. Cl.[7] .................................................. G01R 31/14
(52) U.S. Cl. ............................................................ 324/509
(58) Field of Search .................................. 361/42, 45, 49, 361/56, 84, 54, 673; 340/638, 654, 656; 324/133, 66, 508, 509, 555, 556; 702/117, 158

(56) References Cited

U.S. PATENT DOCUMENTS

| | | |
|---|---|---|
| 4,084,203 * | 4/1978 | Dietz ........................................ 361/45 |
| 4,412,193 | 10/1983 | Bienwald et al. . |
| 5,363,269 * | 11/1994 | McDonald .............................. 361/42 |
| 5,383,759 * | 1/1995 | Fladung ................................. 439/652 |
| 5,477,412 * | 12/1995 | Neiger et al. .......................... 361/45 |
| 5,481,235 * | 1/1996 | Heise et al. ............................ 335/18 |
| 5,541,800 | 7/1996 | Misencik . |
| 5,600,524 | 2/1997 | Neiger . |
| 5,638,243 * | 6/1997 | Torezan .................................. 361/42 |
| 5,729,417 * | 3/1998 | Neiger .................................... 361/45 |

* cited by examiner

Primary Examiner—Safet Metjahic
Assistant Examiner—Etienne LeRoux
(74) Attorney, Agent, or Firm—Paul J. Sutton

(57) ABSTRACT

A novel apparatus for preventing miswiring of GFCI devices is disclosed. The invention is insertable into the receptacle portion of either a single or duplex GFCI device is operative to provide visual and/or audible indication to an installer or user that a miswiring condition is present. The invention comprises an elongated strip constructed of a nonconducting material such as plastic. The strip includes prongs attached to it either on one or both ends for retaining the strip within the receptacle of the GFCI device. A protruding button is positioned on the inner surface of the strip such that when the device is inserted into the GFCI, the button maintains the test button in a depressed state. This insures that the GFCI will be tested upon initial application of electrical power after installation. If the GFCI is not wired properly, visual and/or audible alarm indicators signal a miswiring condition to the installer.

17 Claims, 6 Drawing Sheets

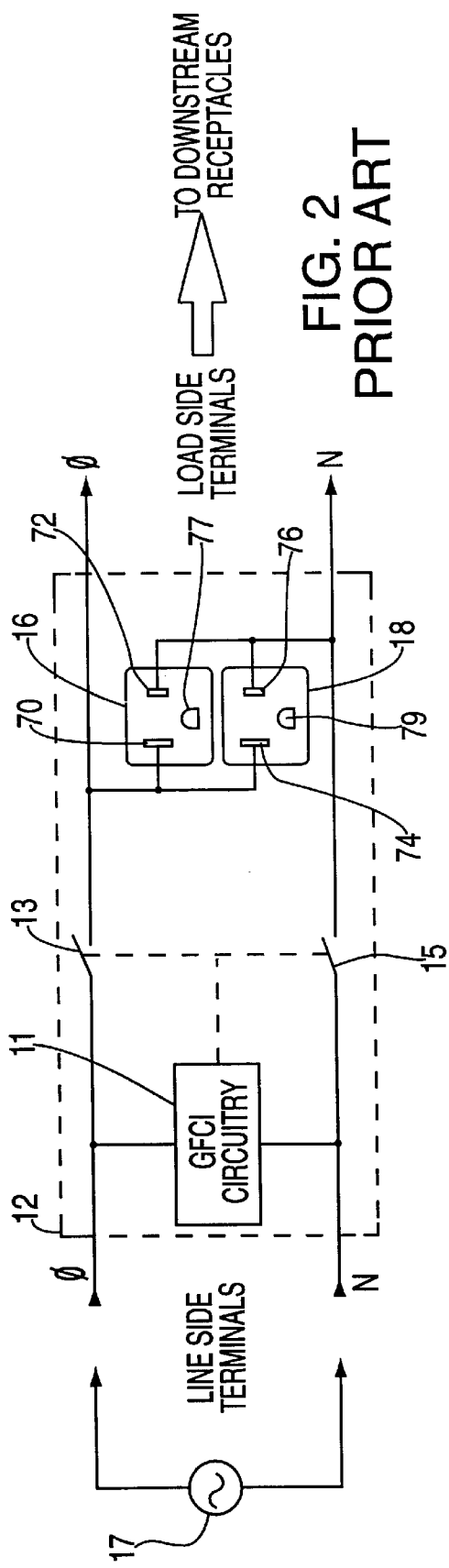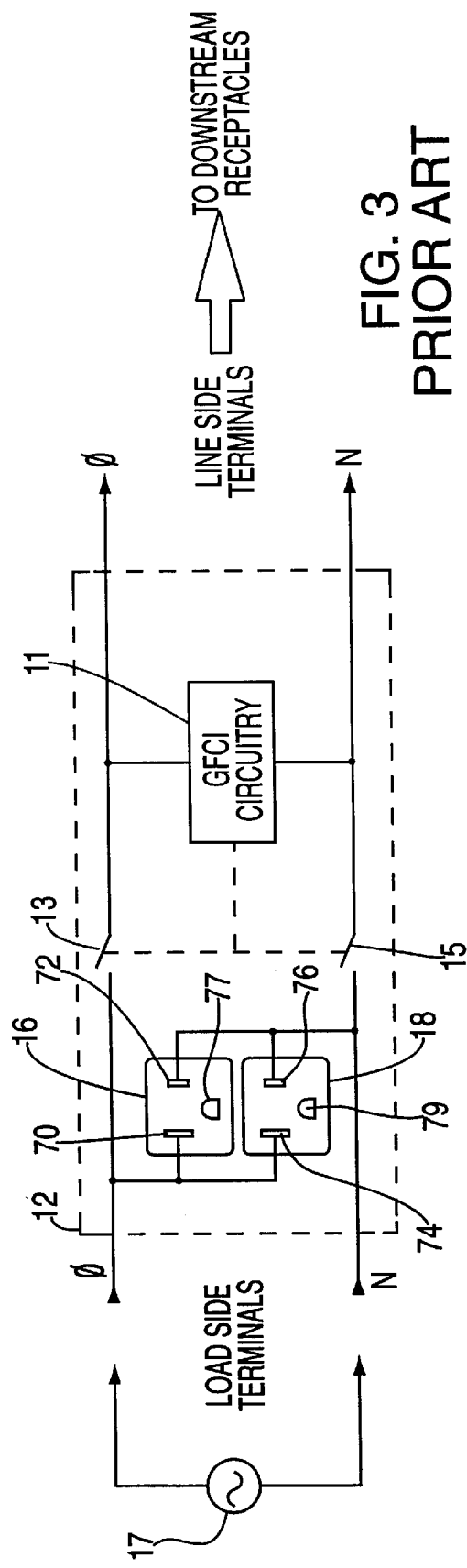

GROUND FAULT CIRCUIT INTERRUPTER MISWIRING PREVENTION DEVICE

This Application is a division of application Ser. No. 08/768,689 filed Dec. 18, 1996.

FIELD OF THE INVENTION

The present invention relates to ground fault circuit interrupters and more particularly relates to an apparatus for preventing the miswiring of ground fault circuit interrupter devices at the time they are installed into the electrical power system.

BACKGROUND OF THE INVENTION

Presently, electrical devices known as ground fault circuit interrupters (GFCIs) enjoy widespread use in many countries around the world, in both commercial and residential environments. In fact, in many places their use is mandatory in certain locations of residential homes such as in kitchens, baths and near pools (i.e., locations close to sources of water).

A typical GFCI incorporating a duplex receptacle provides protection for devices plugged into itself and all devices located downstream of the GFCI device. Typically GFCIs are four terminal devices, two phase or AC leads for connection to AC electrical power and two LOAD leads for connection to downstream devices. Properly wired, a GFCI provides ground fault protection to downstream devices connected to its LOAD leads and to devices plugged into the GFCI receptacle itself However, if the GFCI is reverse wired or improperly wired then downstream devices are still protected if there is a ground fault but the duplex receptacle on the GFCI is not.

A perspective view illustration of a typical prior art GFCI device 12 which incorporates a duplex receptacle within its housing is shown in FIG. 1. The GFCI device 12 comprises a housing 14, two receptacles 16, 18 each comprising hot 70, 74, neutral 72, 76 and ground 77, 79 slots or contacts. Line side hot and neutral screw terminals 24 provide electrical connection points to an alternating current (AC) source. Load side hot and neutral terminals 26 provide electrical connection points for electrical devices located electrically downstream from the GFCI device 12. Tabs 28 provide means for mounting the GFCI device 12 into a wall box. A ground screw terminal 27 is provided to facilitate connecting the GFCI device 12 to a ground wire. In addition, a TEST button 20 is used to periodically test the GFCI device 12 to insure its proper functioning. A RESET button 22 is provided to reset the GFCI device 12 after it has tripped such as after testing.

A high level schematic diagram illustrating the major components of the prior art GFCI device 12 shown in FIG. 1 as properly wired to an AC electrical source is shown in FIG. 2. The AC source 17 is electrically coupled to the hot (i.e., phase) and neutral line side screw terminals 24. Electrically connected across the phase and neutral lines is the GFCI circuit 11. GFCI circuits are well known in the art. Electrical switches 13, 15 are placed in line with the phase and neutral lines. The electrical 13, 15 switches may be electromechanical relays, semiconductor switches or other suitable controllable switching devices. Electrical switch or relay 13 is operative to open circuit the phase conductor and electrical switch or relay 15 is operative to open the neutral conductor in the event a ground fault is detected. On the load side of the relays 13, 15 are the two electrical receptacles 16, 18. The hot contacts 70, 74 are electrically coupled to the phase conductor and the neutral contacts 72, 76 are electrically coupled to the neutral conductor. Ground conductors 77, 79 are electrically coupled to the system ground. The load side phase and neutral terminals 26 provide phase and neutral lines to downstream electrical devices. A pilot light 21 shows the condition of the GFCI. Such a pilot light is shown in U.S. Pat. No. 4,412,193 issued Oct. 25, 1983. See the LED pilot light 81 in FIG. 1.

Under normal operating conditions, relays 13, 15 are closed and electrical current flows to both the receptacles 16, 18 and downstream devices. In the event of a ground fault, GFCI circuitry 11 is operative to open relays 13, 15 and prevent current from flowing to the receptacles 16, 18 and downstream electrical devices connected to the load side terminals.

However, if the GFCI 11 is miswired (miswiring is as shown in FIG. 3, when the GFCI trips (i.e., detects a ground fault) electrical current is properly prevented from flowing to downstream devices via relays 13, 15 opening but electrical power is still present at the two receptacles 16, 18. Power is present at the receptacles 16, 18 in this case because the receptacles 16, 18 are now located before the relays 13, 15 (i.e., further upstream). Thus, in the event the GFCI 11 trips, all downstream devices are protected but the GFCI's own receptacles remain live after the GFCI 11 trips.

One reason that this problem exists is that in new construction, both the input line and downstream cables appear identical when the installer is connecting a new ground fault circuit interrupter. This is especially a problem in new construction where there is no power available in order to test which cable is leading current into the device. The problem is compounded when it is considered that most GFCIs have a test button that will trip and shut off the power when pushed to verify operations of internal functions in the GFCI. However, use of the test button does not indicate whether the built in duplex receptacle is protected. Typical users may not be aware of this. Users simply test the device after installation and verify that the unit trips upon pressing the test button by way of an audible click, for example. This gives the user a false sense that all is well. What is actually happening when the GFCI 11 is reverse wired is that the GFCI 11 disconnects power from and protects everything downstream, but does not protect the receptacle contacts of the GFCI 11 itself. The device will trip depending on the condition of internal components and irrespective of how the GFCI 11 was wired. It does not matter that the GFCI 11 was reverse wired when it was tested.

If the ground fault circuit interrupter is inadvertently powered through its LOAD terminals, the GFCI 11 will still trip normally when confronted with a ground fault and all downstream receptacles will still be protected. However, due to the internal connections, the GFCI's own receptacle terminals will still remain live after the GFCI 11 trips.

Currently, all GFCI's are being shipped with an instruction label attached over the LOAD terminals as per UL requirements. The Consumer Product Safety Commission is asking for something more substantial then simply a warning label. The warning label simply informs the installer to be careful when wiring the LOAD terminals. The label covers those terminals and must be removed if the terminals are to be used. Though this gives a better chance that the warning will be read, something more likely to ensure safety is desirable.

Therefore it is apparent that there is a need for an automatic way to sense when a GFCI is miswired and to indicate to the user an improperly wired GFCI. In addition, when the GFCI is improperly reverse wired the user needs to be alerted with an indicator that cannot be turned off until the electricity is disconnected and the GFCI is correctly wired. Although the background art has attempted to solve this problems the so called solutions have their own disadvantages and drawbacks. For example, one approach utilizes a GFCI with reverse line polarity lamp indicator to indicate proper installation of the GFCI. See, for example, U.S. Pat. No. 4,412,193 issued to Bienwald et al. on Oct. 25, 1983 and assigned to the owner of the present invention. However, a push button needs to be manually pressed in accordance with instructions in order to detect whether the GFCI is miswired. An apparent drawback with this scheme is that the test is never self initiating, i.e., automatic, since the user must always remember to follow the instructions and to actually press a button to test the GFCI. U.S. Pat. No. 5,477,412 issued to Neiger et al. on Dec. 19, 1995 and owned by the assignee of the present invention, is directed to a ground fault circuit interrupter GFCI incorporating miswiring prevention circuitry. Miswiring sense circuitry automatically triggers the generation of visual and audible alarms in the event of miswiring conditions. The circuit employs an alarm inhibiting technique that incorporates sense circuitry connected to the AC terminals on one side of the internal GFCI switches or relays and alarm generation circuitry connected to the load terminal on the opposite side. The electronic scheme of the Neiger et al. patent requires additional circuitry typically in the form of an additional IC chip which significantly adds to the cost of the GFCI. A simpler and more cost-effective means of preventing miswiring is desirable. A mechanical means of automatically triggering an interrupter device upon powering the device is needed.

It is therefore an object of the present invention to provide a mechanism for indicating reverse wiring of an interrupter circuit device.

It is another object of the present invention to provide a mechanism for indicating reverse wiring of an interrupter device which is simple to use and inexpensive and easily manufactured.

Another object of the present invention is to provide a mechanism capable of automatically indicating when a GFCI is miswired or not properly electrically connected to its source of electrical power and to subsequently generate an alarm indicating to the user that a potentially unsafe condition exists.

Still another object of the present invention is to provide a reliable miswiring indicating mechanism which indicates when a GFCI is correctly connected between an AC power source and downstream electrical devices and when it is incorrectly connected in reverse between such AC power source and downstream electrical devices.

Yet another object of the present invention is to have the indicator remain in the on state once generated, until the user corrects the miswiring problem. More specifically, once the indicator turns on, it cannot be shut off without removing the device and installing the device properly.

Still yet another object of the present invention is to provide both a visual indicator and an audible indicator in the event a miswiring condition is detected. The visual indicator might be in the form of a blinking light. The audible indicator might be in the form of a buzzing or high tone sound that could beep on and off at a suitable rate.

An additional object of the invention is to provide a mechanical means to automatically trigger an interrupter device upon installation to test whether the interrupter device is reverse wired.

To that end, a mechanism for indicating reverse wiring of an interrupter device is provided hereby. These and other objects of the invention are accomplished by providing a mechanism for indicating reverse wiring of a interrupter device comprising means for automatically triggering the interrupter device when the interrupter device is first powered, and indicator means electrically connected between phase and neutral lines in the interrupter device for indicating when the interrupter is reverse wired with a load connected to line terminals of the interrupter device and a source of power connected to load terminals of the interrupter device. In one embodiment of the invention there is provided a method for indicating reverse wiring of an interrupter device.

Another embodiment of the invention provides an auxiliary device for pushing a test button of an interrupter device comprising means for securing the auxiliary device to the interrupter adjacent the test button, and a protrusion for pushing the test button when the auxiliary device is secured to the interrupter device.

A further embodiment of the invention provides an interrupter system comprising an interrupter device which comprises a sensor generating a sensor signal; sensing circuit means for detecting an undesirable condition based on said sensor signal and for generating a control sense signal when the undesirable condition is detected; switching circuit means for selectively passing current in accordance with the control sense signal; contactor means including switches located in phase and neutral lines for selectively interrupting current between a power source and a load by opening the switches when the switching circuit means passes current; receptacle means connected to the phase and neutral lines; and a test button for simulating an undesirable condition; and an auxiliary device for pushing the test button comprising means for securing the auxiliary device to the interrupter device adjacent the test button; and a protrusion for pushing the test button when the auxiliary device is secured to the interrupter device.

The invention further provides a circuit for indicating reverse wiring of an interrupter device comprising triggering means for triggering the interrupter device when the interrupter device is first powered; and indicator means electrically connected between phase and neutral lines for indicating when the interrupter device is reverse wired with a load connected to line terminals of the interrupter device and a source of power connected to load terminals of the interrupter device.

The invention also provides a method for indicating the reverse wiring of an interrupter device.

SUMMARY OF THE INVENTION

A novel apparatus for preventing miswiring of GFCI devices is disclosed. The invention is insertable into the receptacle portion of either a single or duplex GFCI device is operative to provide visual and/or audible indication to an installer or user that a miswiring condition is present. The invention comprises an elongated strip constructed of a nonconducting material such as plastic. The strip includes prongs attached to it either on one or both ends for retaining the strip within the receptacle of the GFCI device. A protruding button is positioned on the inner surface of the strip such that when the device is inserted into the GFCI, the button maintains the test button in a depressed state. This insures that the GFCI will be tested upon initial application of electrical power after installation. If the GFCI is not wired properly, visual and/or audible alarm indicators signal a miswiring condition to the installer.

BRIEF DESCRIPTION OF THE DRAWINGS

The invention is herein described, by way of example only, with reference to the accompanying drawings, wherein:

FIG. 2 is a high level schematic diagram of the device of FIG. 1 illustrating a GFCI properly wired to an AC electrical source;

FIG. 3 is a high level schematic diagram of the device of FIG. 1 illustrating a GFCI miswired to an AC electrical source;

DETAILED DESCRIPTION OF THE INVENTION

The apparatus of the present invention is a miswiring prevention device that is inserted into the duplex receptacle of a conventional GFCI device. The miswiring prevention device provides positive indication via visual or audible means to an electrical installer or other user as to whether the GFCI was properly or improperly wired to the electrical power network. The miswiring prevention device of the present invention is preferably inserted into a conventional GFCI at the time of manufacture and packaged together as a single unit, thus giving an installer maximum miswiring prevention capability.

A GFCI is considered miswired when it is installed in an electrical network in any other fashion other than that illustrated in FIG. 2. The apparatus of the present invention, however, only addresses the miswiring condition of GFCI line and load terminal reversal as illustrated in FIG. 3.

Figure 1:
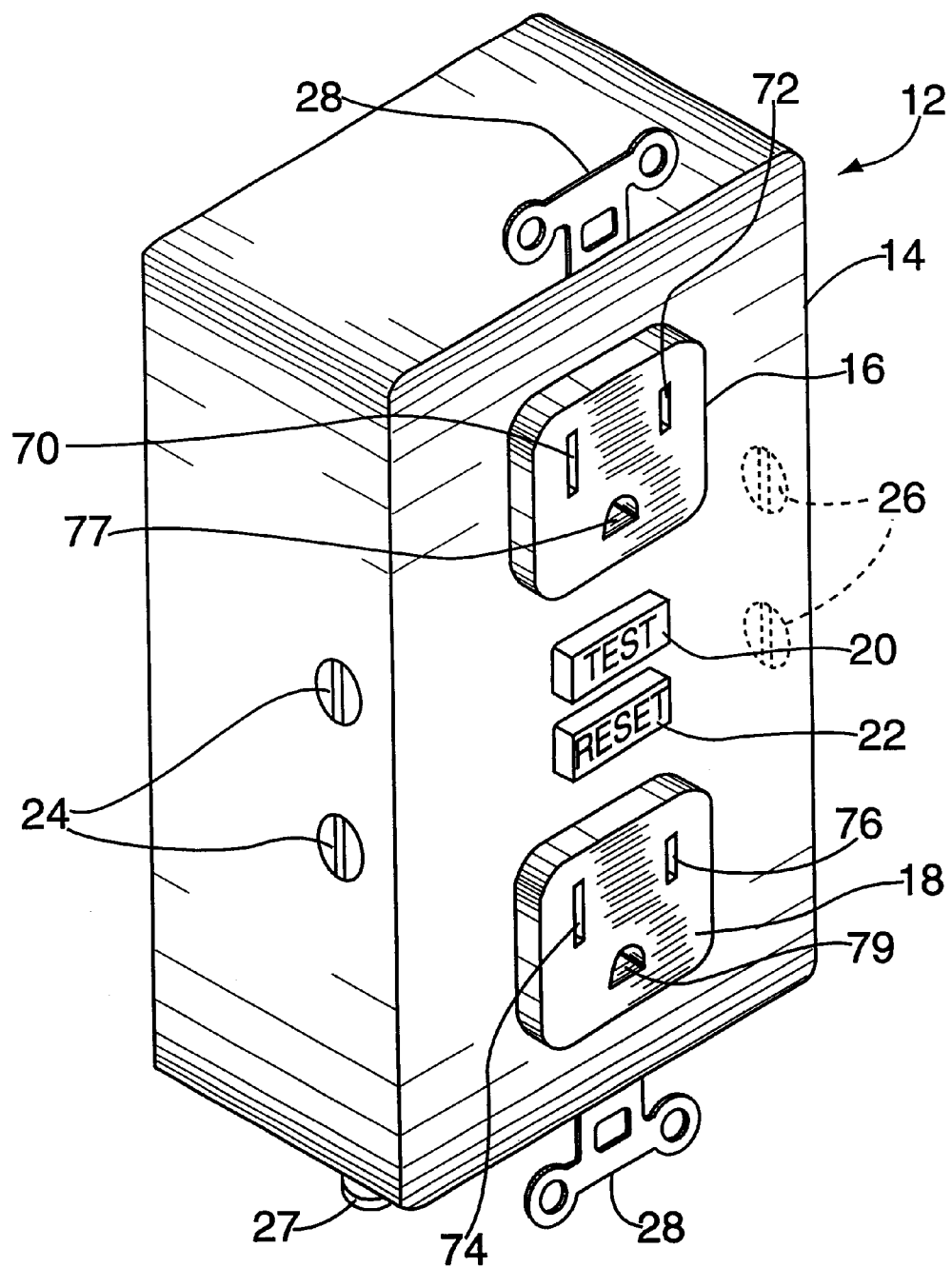
FIG. 1 is a perspective view illustration of a typical prior art GFCI device which incorporates a duplex receptacle within its housing.
Figure 4:
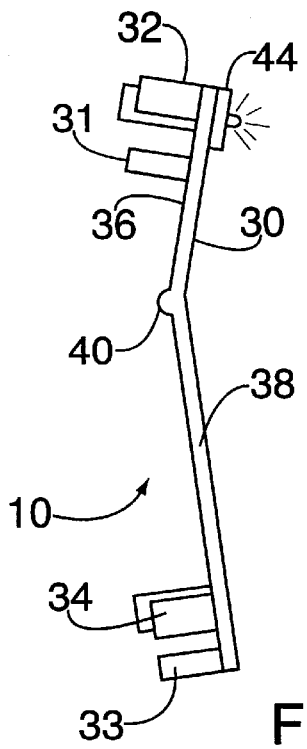
FIG. 4 is a side elevational view of an example of a miswiring prevention device incorporating a visual alarm and constructed in accordance with a preferred embodiment of the present invention.

A side elevational view of an example of a miswiring prevention device incorporating a visual alarm, generally referenced 10, constructed in accordance with a preferred embodiment of the present invention is shown in FIG. 4. The device comprises an elongated strip 30 of insulating material having an outer surface, an inner surface, an upper portion 36 and a lower portion 38. The elongated strip 30 having a bend toward the middle of its length. At the position of the bend is situated a protruding button or tab 40. At the end of the upper portion 36 of the elongated strip are a pair of prongs 32 and a ground prong 31 constructed to fit into standard receptacle openings or slots 70, 72, 77 (FIG. 1). At the end of the lower portion 38 of the elongated strip 30 is another pair of prongs 34 and a ground prong 33 constructed to fit into standard receptacles openings or slots 74, 76, 79 (FIG. 1). The length of the strip is long enough such that prongs 31, 32, 33, 34 are able to mate with the receptacle slots in a conventional GFCI furnished with a duplex receptacle.

The bend of the strip (i.e., button 40) is positioned such that when the device 10 is inserted into a GFCI receptacle, the button engages the TEST button 20 (FIG. 1) sufficiently to insure that the test function will be activated when power is applied after installation of the GFCI device. The strip is constructed of a suitable insulating material of suitable thickness such that after prongs 32, 34 are fully inserted into the GFCI receptacle the strip lies substantially flat along the surface of the receptacle. In addition, the prongs are constructed such that they sufficiently grip the contacts in the receptacle slots to apply enough force on the button 40 to insure activation of the TEST button on the GFCI device. The prongs must also be constructed such that the strip, once inserted into the GFCI receptacle, is able to remain correctly positioned for extended periods of time and is able to withstand normal handling such as during shipping and packaging of the device.

Alternatively, the elongated strip can be made flat without any bend as long as the prongs 31, 32, 33, 34 are suitably constructed to provide enough gripping force for button 40 to engage the test function on the GFCI device. The prongs 31, 32, 33, 34 must grip the contacts in the slots in the GFCI receptacle sufficiently so that the miswiring prevention device remains in place without slipping until physically removed by the user.

In a preferred embodiment, the strip is constructed from plastic due to its beneficial insulating and resiliency properties. However, other suitable nonconducting materials may also be used. The prongs 32 attached to the upper 36 portion of the strip 30 must be constructed of a conducting material. The prong 31 attached to the upper portion of the strip 30 and the prongs 33, 34 attached to the lower portion of the strip 38 are preferably constructed of a nonconducting material such as plastic.

The miswiring prevention device illustrated in FIG. 4 also comprises a visual alarm 44. The visual alarm 44 comprises a visual indicator and associated circuitry housed adjacent to the prongs 31, 32. The prongs 32 are electrically connected to the visual alarm 44. The visual indicator within the visual alarm 44 is activated whenever electrical power is present at the prongs 32.

The miswiring prevention device 10 is operative to provide a warning if the GFCI is miswired. As explained previously, miswired GFCIs interrupt electrical power to downstream devices but not to their own receptacles. When electrical power is initially applied after installation, the test function is immediately activated due to TEST button 20 being pressed via button 40 on the inner surface of the strip 30. If the GFCI device was properly installed the visual indicator remains off. However, if the GFCI device was improperly installed (i.e., miswired with the line and load sides reversed) the visual indicator will be activated alerting the installer that a miswiring condition exists. Another feature of the present invention is that the GFCI receptacle cannot be used until the miswiring prevention device 10 is removed. Thus, once power is applied, it is difficult to ignore any alarm indication that may be present.

Figure 5:
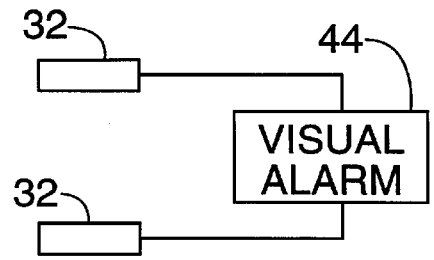
FIG. 5 is a schematic diagram illustrating the electrical connection of the visual indicating device to the prongs of the miswiring preventing device.

A schematic diagram illustrating the visual alarm 44 of the miswiring prevention device 10 is shown in FIG. 5. The visual indicator may comprise a neon lamp, light emitting diode (LED) lamp or a liquid crystal device. In addition, the visual indicator may comprise a one shot device such as a fusible wire that changes the transparency or color of a window within the visual alarm. The visual alarm 44 also comprises suitable circuitry for driving the visual indicator.

Figure 6:
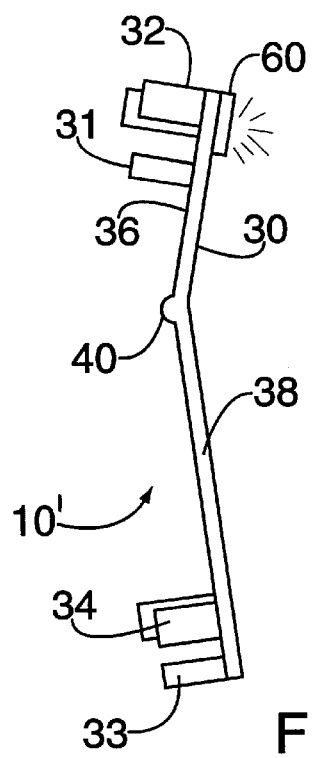
FIG. 6 is a side elevational view of an example of a miswiring prevention device incorporating an audible alarm and constructed in accordance with a preferred embodiment of the present invention.

As an alternative means of indicating a miswiring condition, audible alarm means may be used either alone or in combination with the visual alarm 44 means described above. A side elevational view of an example of a miswiring prevention device 10' incorporating an audible alarm and constructed in accordance with preferred embodiment of the present invention is shown in FIG. 6. Similar to the miswiring prevention device 10 of FIG. 4, the device 10' of FIG. 6 comprises a flexible elongated insulated strip 30 having an upper portion 36, a lower portion 38, an outer surface and an inner surface, a pair of prongs 32 and ground prong 31 attached to the upper portion 36 and a pair of prongs 34 and a ground prong 33 attached to the lower portion 38. A button or tab 40 is positioned on the inner surface of the strip such that when the device 10' 10 is fully inserted into a GFCI receptacle, button 40 engages the TEST button 20 (FIG. 1) on the GFCI device.

Device 10 also comprises audible alarm 60 attached to the upper portion 36 of the strip. An audible indicator in the alarm 60 is activated in the event a miswiring condition is detected. The prongs 32 are constructed of a conducting material and are electrically connected to the audible alarm 60. The prongs 31, 33, 34 are preferably made of a nonconducting material such as plastic.

Similar to the device 10' of FIG. 4, the miswiring prevention device 10' of FIG. 6 is operative to provide a warning if the GFCI is miswired. When electrical power is initially applied after installation, the test function is immediately activated due to TEST button 20 being pressed via button 40 on the inner surface of the strip. If the GFCI device was properly installed the audible indicator remains off. However, if the GFCI device was improperly installed (i.e., miswired with the line and load terminals reversed) the audible indicator will be activated alerting the installer that a miswiring condition exists.

Figure 7:
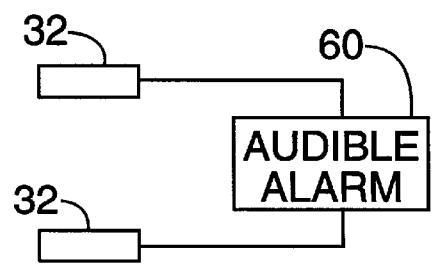
FIG. 7 is a schematic diagram illustrating the electrical connection of the audible indicating device to the prongs of the miswiring prevention device.

A schematic diagram illustrating the audible alarm 60 of the miswiring prevention device 10 of FIG. 6 is shown in FIG. 7. The audible alarm 60 is electrically coupled to the prongs 32. The audible indicator may comprise a buzzer, piezo buzzer, bell or other suitable audible indicating means. In addition, audible alarm 60 comprises suitable circuitry for driving the audible indicator.

Alternatively, the audible alarm can be used in combination with the visual alarm to provide a more effective indication to the user that the GFCI device is not properly wired requiring the GFCI device to be rewired correctly.

In an alternative embodiment (not shown) the apparatus of the present invention can be constructed to operate with GFCI devices that incorporate only a single receptacle rather than a duplex receptacle. In this embodiment, the upper portion of the strip comprises the prongs and alarm indicator and the lower portion comprises the button 40. As in the previous embodiments, the strip and the prongs 31, 32 are constructed in a suitable fashion to maintain the TEST button 20 (FIG. 1) in a pressed state when the miswiring device 10 is inserted into a GFCI receptacle.

Figure 8:
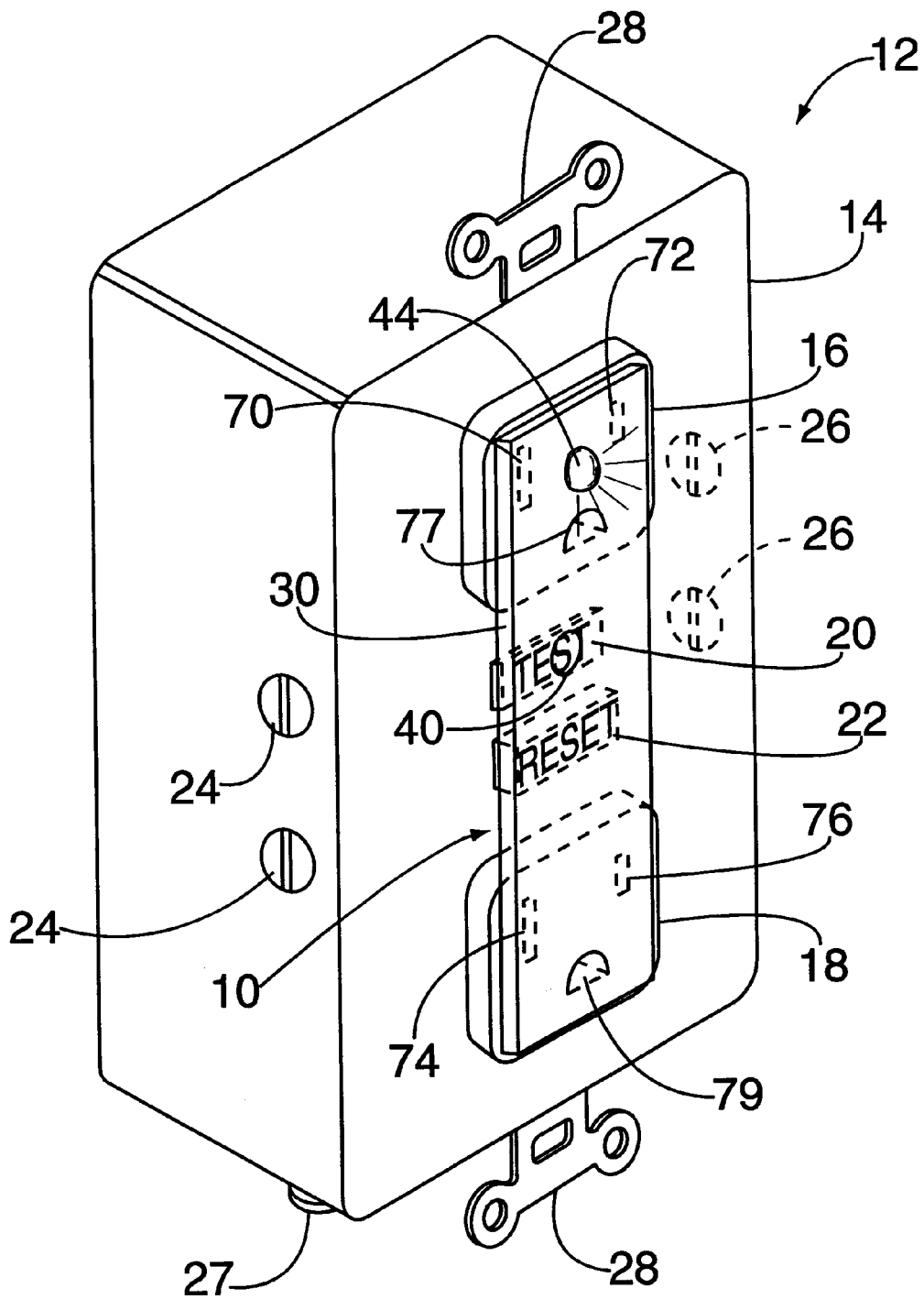
FIG. 8 is a perspective view illustration of the miswiring prevention device of the present invention inserted in the duplex receptacle portion of a GFCI device.
Figure 9:
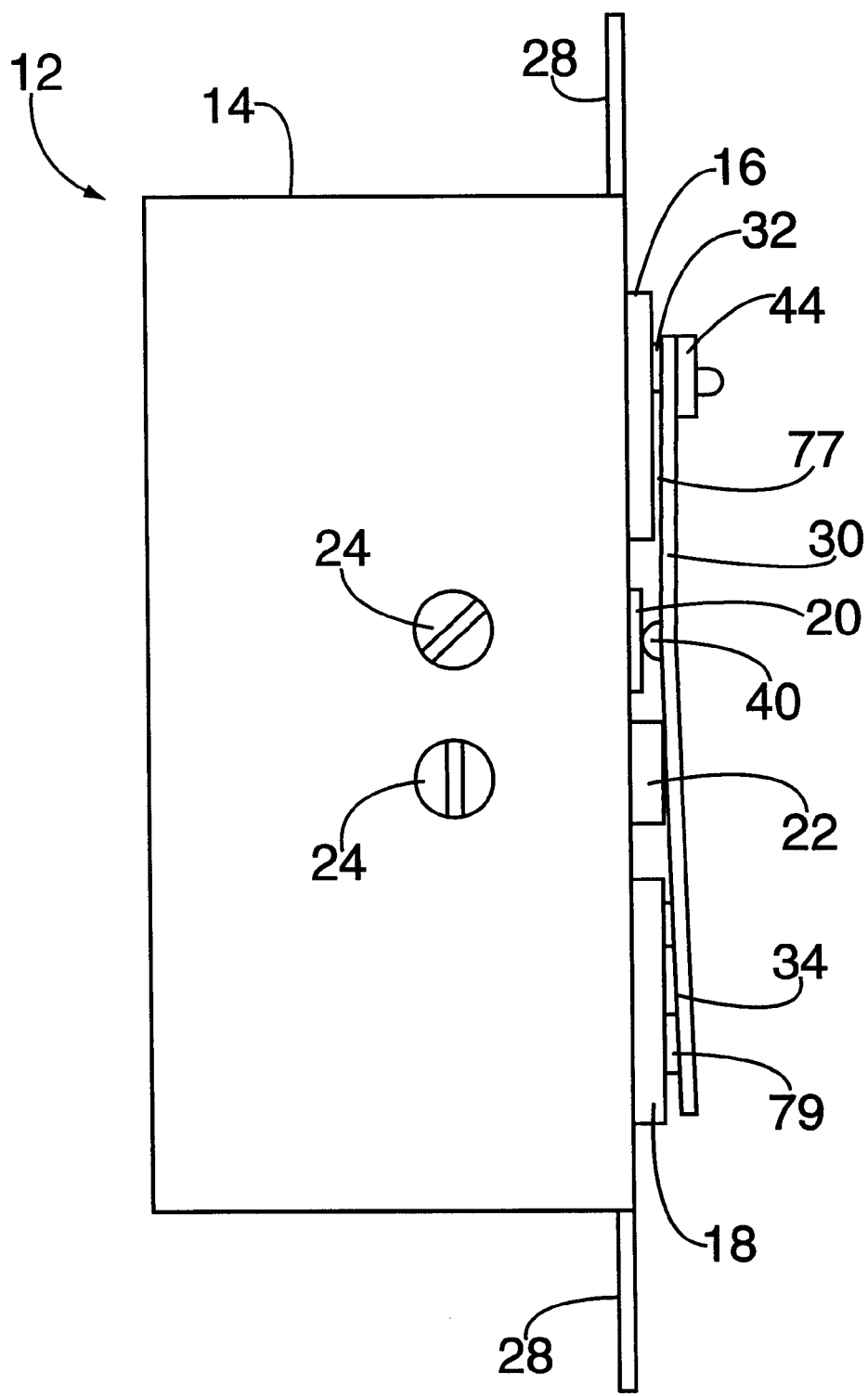
FIG. 9 is a side elevational view illustration of the miswiring prevention device of the present invention inserted in the duplex receptacle portion of a GFCI device.

A perspective view illustration of the miswiring prevention device 10 of the present invention inserted in the duplex receptacle portion of a GFCI device 12 is shown in FIG. 8. A side view illustration is shown in FIG. 9. The prongs 31, 32, 33, 34 are inserted into the receptacles 16, 18 of the GFCI device 12. The button 40 on the inner side of the strip 30 is pressing the TEST button 20 in. This insures that the GFCI will be tested upon application of electrical power. The strip 30 is shown substantially flat due to the holding force of the prongs within the contacts in the receptacles. The resiliency of the material used to the construct the strip provides the force to maintain the TEST button in an activated state. Pilot light 21 will be seen through the elongate strip if lit.

Figure 10:
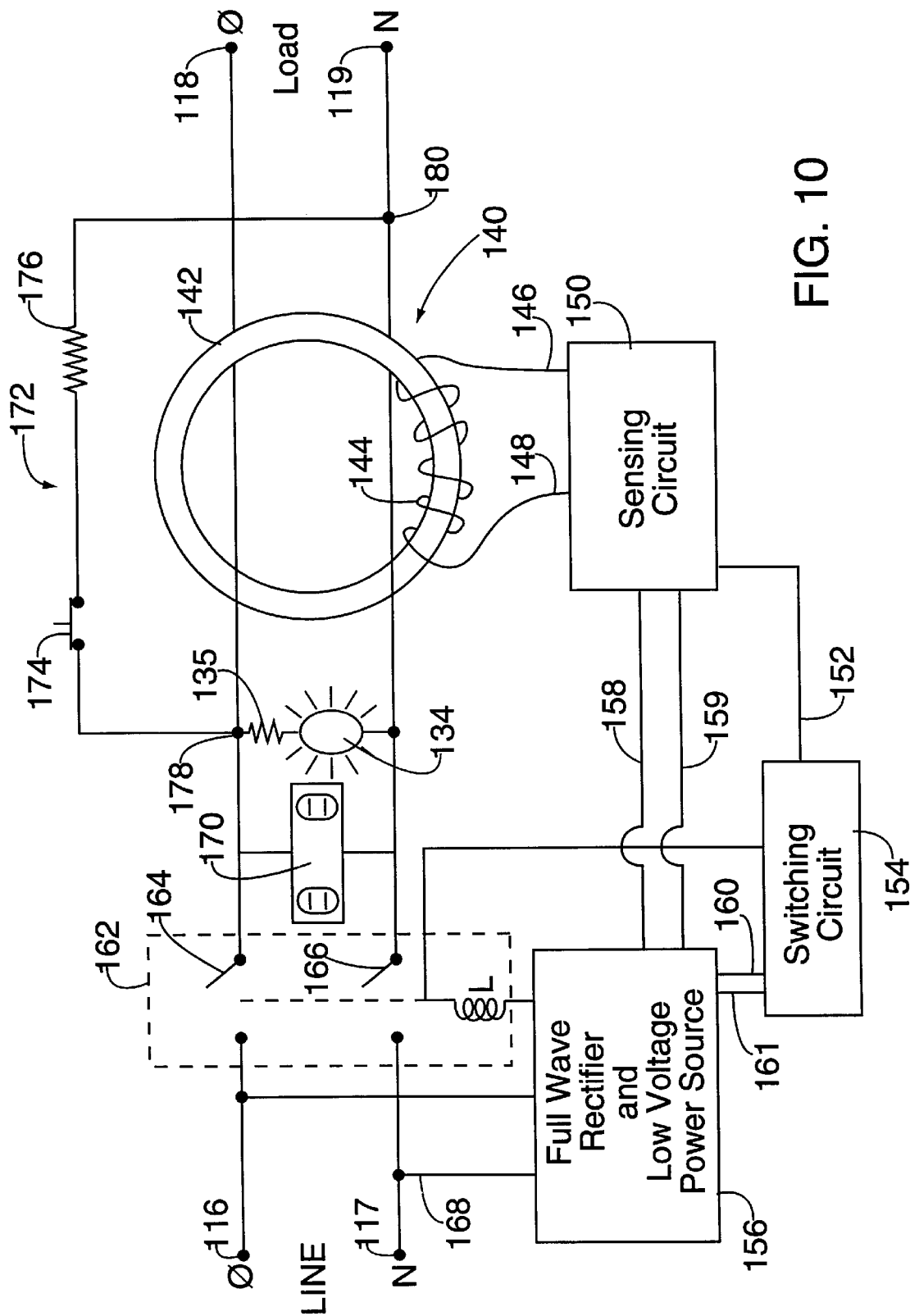
FIG. 10 is a schematic electrical circuit diagram of the interrupter system of the present invention.

FIG. 10 illustrates the electric circuit for the interrupter system. A ground fault circuit interrupter is illustrated. The interrupter system of FIG. 10 includes terminals 116 and 117 for receiving the phase and neutral lines from an AC power source. The interrupter system further includes terminals 118 and 119 for connection to a downstream load. The interrupter system includes a sensor 140 which includes a toroidal core 142 with a coil 144 for sensing a ground fault condition.

The ends of coil 144, shown as leads 146 and 148, are input to sensing circuit 150. The sensor 140 generates a sensor signal on leads 146 and 148. The sensing circuit 150 detects an undesirable ground fault condition based upon the sensor signals on leads 146 and 148. The sensing circuit 150 generates a control sense signal on line 152 when a ground fault is detected. The sensing circuit 150 can be any GFCI IC such as a National Semi Conductor Inc. (NSI) integrated circuit LM1851 which is commercially available. Further, a Motorola circuit MC3426 which can be purchased may be used with simple modifications. These circuits can be used in the circuit in accordance with known requirements of the chosen IC.

Switching circuit 154 selectively passes current in accordance with the control sense signal on line 152 from the sensing circuit 150. The interrupter system includes full wave rectifier and low voltage power source 156 for powering the electronics of the interrupter device. The full wave rectifier and low voltage power source draws current from the phase line connected to terminal 116. The low voltage power source 156 provides power to the sensing circuit 150 and the switching circuit 154 via lines 158, 159, 160, and 161, respectively. The interrupter system further includes contactor 162 which includes an inductor L and switches 164 and 166. Switch 164 selectively disconnects power from the phase conductor and switch 166 selectively disconnects power from the neutral conductor. When no current flows through inductor L the switches 164 and 166 remain closed and current is allowed to flow through the interrupter system from AC-line terminals 116 and 117 to LOAD terminals 118 and 119. When current flows through the inductor L switches 164 and 166 open interrupting power from the line terminals 116 and 117. Switching circuit 154 determines if current will flow through inductor L in accordance with the control sense signal on line 152 from sensing circuit 150. Switching circuit 154 typically includes a silicon controlled rectifier (SCR) with the anode connected to the inductor L and the cathode connected to the neutral line at terminals 117 via line 161, the low voltage power source 156 and line 168. The silicone controlled rectifier has a gate which is controlled by the control sense signal from the sensing circuit 150 on line 152. Accordingly, when an undesirable ground fault condition is detected by sensing circuit 150, the control sense signal on line 152 causes the flow of current through the SCR in switching circuit 154 by controlling the gate of the silicone controlled rectifier. A path of current is established from the phase line from terminal 116 through the low voltage power source 156, through inductor L, through the silicone controlled rectifier of switching circuit 154 and back to the neutral line at terminal 117 via conductor 161, circuit 156 and conductor 168. Thus, the switches 164 and 166 open interrupting power to the load connected to the interrupter system. When power is interrupted, terminals 118 and 119 are not live and downstream loads are protected. Further, loads connected to the receptacles of duplex receptacle 170 are also protected. Additionally, the indicator 134 receives no power. The indicator 134 is off The interrupter system of FIG. 10 includes a test circuit 172 which comprises a test button 174 (corresponding to test button 20 of FIGS. 1, 8 and 9) and a resister 176. When the test button 174 is pushed a ground fault condition is simulated. The testing circuit 172 includes the test button 174 and the resistance 176 between the terminal 178 connected to the phase line and the terminal 180 on the opposite side of the sensor 140 connected to the neutral line. The test button 174 has been separated from the duplex receptacle 170 for ease of explanation. Actually, the test button 174 would be positioned as test button 20 in FIG. 1 between receptacles 16 and 18. Closing of the button 174 causes an unbalance of currents flowing through phase and neutral lines through the sensor 140 to simulate a ground fault current condition. Operation of the test button 174 trips the interrupter circuit. As illustrated in FIG. 10, the test button is pushed. The strip 30 of FIGS. 4, 6, 8 and 9 pushes the test button 174. The interrupter system is manufactured with the strip 30 plugged into the interrupter device so that the test 174 button is pushed when the interrupter system is installed. Thus, a ground fault condition is simulated and the switches 164 and 166 disconnect the electrical current from the line terminals 116 and 117. When the device has been properly wired, there is no power across the indicator 134 and resister 135. The receptacle outlets of duplex receptacle 170 are protected and the indicator 134 does not turn on.

Operation of the interrupter system of FIG. 10 will now be described when the interrupter system is reverse wired. When terminals 118 and 119 which are meant to be connected to a downstream load are connected to an AC power source and terminals 116 and 117 which are meant to be connected to an AC power source are instead connected to a downstream load, the interrupter system is improperly reverse wired. In this event, the interrupter system still trips protecting downstream loads connected to terminals 116 and 117. More particularly, a ground fault condition is still detected by sensing circuit 150 to generate a sense control signal on line 152 which controls the gate of the silicone controlled rectifier in switching circuit 154 to permit current to flow through the silicon controlled rectifier. Current flows from the phase line from terminal 118, through switch 164, to the full wave rectifier and low voltage power source 156, to the inductor L, through the silicon controlled rectifier, and to the neutral line through line 161, the power source 156, line 168 and terminal 117. Current through inductor L causes switches 164 and 166 to open interrupting the flow of current. Since power comes from terminals 118 and 119 the receptacles of duplex receptacle 170 are live and indicator 134 turns on. Indicator 134 indicates that the interrupter device is reverse wired.

The test button 174 is pushed down by the strip 30 to simulate the ground fault condition which trips the interrupter system. The strip 30 is plugged into the receptacles to push down the test button 174 at the time of manufacture and before distribution, sale and installation Thus, the indicator 134 signals the reverse wired hazard when the interrupter system is first installed. The indicator 134 will continue to be turned on until power is disconnected from terminals 118 and 119. If the indicator 134 remains off after power is connected, the load/line terminals are properly connected. The strip 30 may be removed or used as a protective shield for the receptacle once the button 40 has been removed, if desired. The indicator 134 may be in the interrupter device or may be part of the auxiliary device connected between conductive prongs 32. The indicator 134 may be the pilot light 21 of the interrupter device. The indicator 134 may be audible or visual. Both visual and audible indicators may be provided.

Although the invention has been described with respect to a ground fault circuit interrupter, other types of interrupter devices may also be employed such as interrupter devices for over voltage, over temperature or other conditions.

The present invention also includes a method for indicating the reverse wiring of an interrupter device.

Although the invention has been described with reference to the preferred embodiments, it will be apparent to one skilled in the art that variations and modifications are contemplated within the spirit and scope of the invention. The drawings and descriptions of the preferred embodiments are made by way of example rather than to limit the scope of the invention, and it is intended to cover within the scope and spirit of the invention all such changes and modifications.

I claim:

1. A simple add-on electro-mechanical device for indicating reverse wiring of an interrupter device comprising:
   a) an elongate body member having a first end and a second end and a central portion therebetween;
   b) one set of conductive prongs on said body member adjacent one of said first and second ends, for insertion in the openings of a receptacle of an interrupter device;
   c) a button on said central portion adapted to depress a test button of said interrupter device when said device is installed on said interrupter device; and
   d) indicator means electrically connected between phase and neutral lines in said interrupter device and to said conductive prongs for indicating when said interrupter device is reverse wired with a load connected to line terminals of said interrupter device and a source of power connected to load terminals of said interrupter device.

2. A simple add-on electro-mechanical device, as defined in claim 1, wherein said conductive prongs and said center portion of said elongate body cooperate to depress the test button by means of said button upon the installation of said device to said interrupter device.

3. A simple add-on electro-mechanical device, as defined in claim 2, wherein said device is installed on said interrupter device at time of manufacture.

4. A simple add-on electro-mechanical device, as defined in claim 2, wherein said device is installed on said interrupter device at time of installation.

5. A simple add-on electro-mechanical device, as defined in claim 1, wherein said indicator means is a visual alarm signal.

6. A simple add-on electro-mechanical device, as defined in claim 1, wherein said indicator means is an audible alarm signal.

7. A simple add-on electro-mechanical device, as defined in claim 1, wherein said indicator means is both visual and audible alarm signals.

8. A simple add-on electro-mechanical device, as defined in claim 1, further comprising one set of non-conductive prongs on said body member adjacent the other of said first and second ends, for insertion in the openings of a further receptacle of said interrupter device.

9. A method for indicating reverse wiring for an interrupter device comprising the steps of:
   a) inserting the conductive prongs of a simple add-on electro-mechanical device into openings of a receptacle of an interrupter device;
   b) depressing a test button on said interrupter device with the button on said electro-mechanical device; and
   c) indicating when said interrupter device is reverse wired with a load connected to line terminals of said interrupter device and a source of power connected to load terminals of said interrupter device by electrically connecting an indicator means between phase and neutral lines of said interrupter device.

10. The method, as defined in claim 9, further comprising the step of:
    a) inserting the non-conductive prongs of said simple add-on electro-mechanical device into the openings of a second receptacle of said interrupter device.

11. A method for indicating reverse wiring for an interrupter device comprising the steps of:
    a) inserting the conductive prongs of a simple add-on electro-mechanical device having conductive and non-conductive prongs into openings of a first of two receptacles of an interrupter device;
    b) inserting the non-conductive prongs of said device into openings of a second of said two receptacles;
    c) causing a button on said device to depress a test button on said interrupter device;
    d) installing said interrupter device with said device in place on said interrupter device;
    e) applying power to said interrupter device; and
    f) indicating when said interrupter device is reverse wired with a load connected to line terminals of said interrupter device and a source of power connected to load terminals of said interrupter device by electrically connecting an indicator means between phase and neutral lines of said interrupter device.

12. The method for indicating reverse wiring as defined in claim 11, wherein the reverse wire condition of an interrupter device is indicated visually.

13. The method for indicating reverse wiring, as defined in claim 11, wherein the reverse wire condition of an interrupter device is indicted audibly.

14. The method for indicating reverse wiring, as defined in claim 11, wherein the reverse wire condition of an interrupter device is indicated both visually and audibly.

15. A simple add-on electro-mechanical device, as defined in claim 8, wherein said button may be snapped off to convert said device into a child-proof shield for said receptacles.

16. A simple add-on electro-mechanical device, as defined in claim 1, wherein said elongate body member is transparent.

17. A simple add-on electro-mechanical device, as defined in claim 1, wherein said indicator means is the pilot light of said interrupter device.

* * * * *